United States Patent [19]

Hong

[11] Patent Number: 5,475,295
[45] Date of Patent: Dec. 12, 1995

[54] ELECTRONIC DEVICE CAPABLE OF CHECKING POWER SUPPLY STATUS

[75] Inventor: Kwon-pyo Hong, Suwon, Rep. of Korea

[73] Assignee: Samsung Electronics Co., Ltd., Kyungki, Rep. of Korea

[21] Appl. No.: 170,662

[22] Filed: Dec. 16, 1993

Related U.S. Application Data

[63] Continuation of Ser. No. 876,098, Apr. 30, 1992, abandoned.

[30] Foreign Application Priority Data

Aug. 14, 1991 [KR] Rep. of Korea ............... 91-14103

[51] Int. Cl.⁶ ............................ H02J 7/04; G08B 21/00
[52] U.S. Cl. ............................ 320/43; 320/48; 324/433; 340/636
[58] Field of Search .................... 340/635, 636, 340/531; 320/43, 44, 48; 324/426, 427, 433

[56] References Cited

U.S. PATENT DOCUMENTS

| | | | |
|---|---|---|---|
| 4,231,027 | 10/1980 | Mann et al. | 340/636 |
| 4,408,282 | 10/1983 | Hof | 364/482 |
| 4,432,360 | 2/1984 | Mumford et al. | 128/419 PG |
| 4,578,671 | 3/1986 | Flowers | 340/636 |
| 4,626,848 | 12/1986 | Ehlers | 340/825.69 |
| 4,693,110 | 9/1987 | Juengel | 340/636 |
| 4,799,039 | 1/1989 | Balcom et al. | 340/333 |
| 4,857,918 | 8/1989 | Nukushina et al. | 340/870.01 |
| 5,019,803 | 5/1991 | Maram | 340/539 |
| 5,140,310 | 8/1992 | DeLuca et al. | 340/636 |
| 5,144,248 | 9/1992 | Alexandres et al. | 340/636 |

*Primary Examiner*—Peter S. Wong
*Assistant Examiner*—Adolf Berhane
*Attorney, Agent, or Firm*—Sughrue, Mion, Zinn, Macpeak & Seas

[57] ABSTRACT

An electronic device is disclosed having a main body and being in communication with a remote controller capable of transmitting and receiving signals to and from the electronic device. The main body has a portable power supply and is controlled by the remote controller. The electronic device is composed of a power supply checking device that checks the status of the portable power supply when receiving a power supply checking signal from the remote controller. The remote controller has a liquid crystal display for displaying on the remote controller the status of the portable power supply in response to a status signal transmitted from the power supply checking device. Thus, the power supply status of the portable power source can easily be detected by the remote controller.

24 Claims, 2 Drawing Sheets

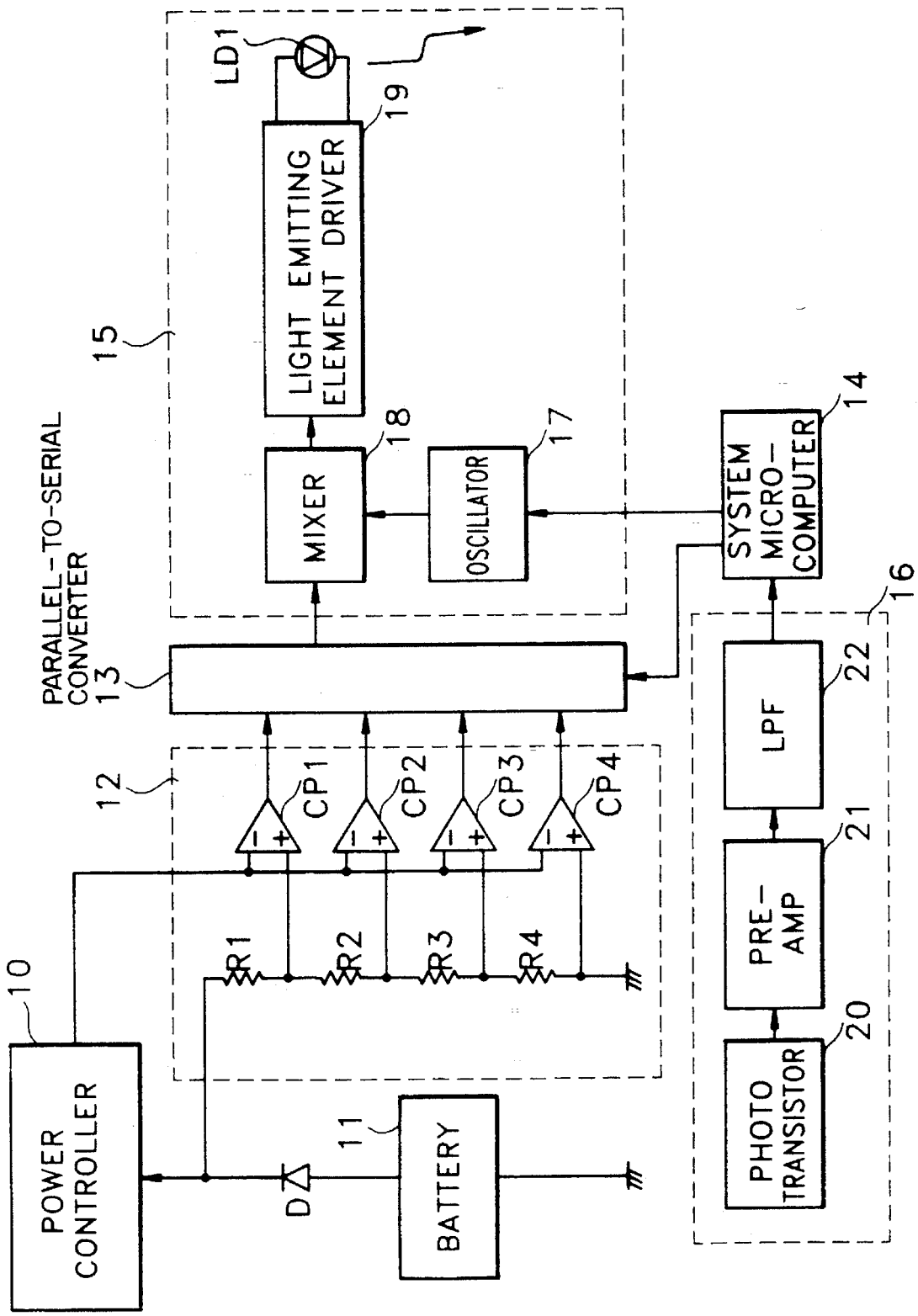

ELECTRONIC DEVICE CAPABLE OF CHECKING POWER SUPPLY STATUS

This is a Continuation of application Ser. No. 07/876,098, filed Apr. 30, 1992 now abandoned.

BACKGROUND OF THE INVENTION

The present invention relates in general to an electronic device having a portable power supply, such as a battery or the like, being controlled by a remote controller, and more particularly, to an electronic device capable of checking the power supply status thereof by using the remote controller.

Generally, because all the control functions for an electronic device are commonly attached to its main body, people pursue convenience by using a remote controller to remotely control the device. All functions of a remote-controlled device are controlled by a remote controller within a certain distance. When a remote controlled electronic device is portable, it generally uses a portable power supply, so the power supply status of the device needs to be confirmed by the remote controller. However, conventional devices have been unable to confirm the state of the power supply, i.e., a battery, via a remote controller. Therefore, when a user uses an electronic device whose power supply is discharged, because the user is at a distance from the electronic device, he cannot confirm the current status of the power supply.

SUMMARY OF THE INVENTION

Accordingly, it is an object of the present invention to provide an electronic device having a portable power supply (for example, a battery) with the capability of confirming the power supply status through a remote controller by which all the functions of the electronic device are controlled.

To achieve the object mentioned above, there is provided a power supply checking system having an electronic device and a remote controller for transmitting and receiving signals to and from said electronic device, said electronic device having a power supply and being controlled by said remote controller, the system comprising:

in said remote controller, means for transmitting to said electronic device a power supply checking signal, and liquid crystal display for displaying a power status indication in response to receipt of a power status signal from said electronic device; and in said electronic device, power supply checking means responsive to receipt of said power supply checking signal from said remote controller for checking the power supply status of said power supply, and transmitting means for transmitting to said remote controller said power status signal representing the status determined by said checking means.

BRIEF DESCRIPTION OF THE DRAWINGS

The above and other objects and advantages of the present invention will become more apparent from the following detailed description of a preferred embodiment of the present invention with reference to the attached drawings, in which:

FIG. 1A is a schematic block diagram of a main body of an electronic device with a function for checking the power supply status of the electronic device according to the present invention.

DETAILED DESCRIPTION OF THE INVENTION

Figure 1B:
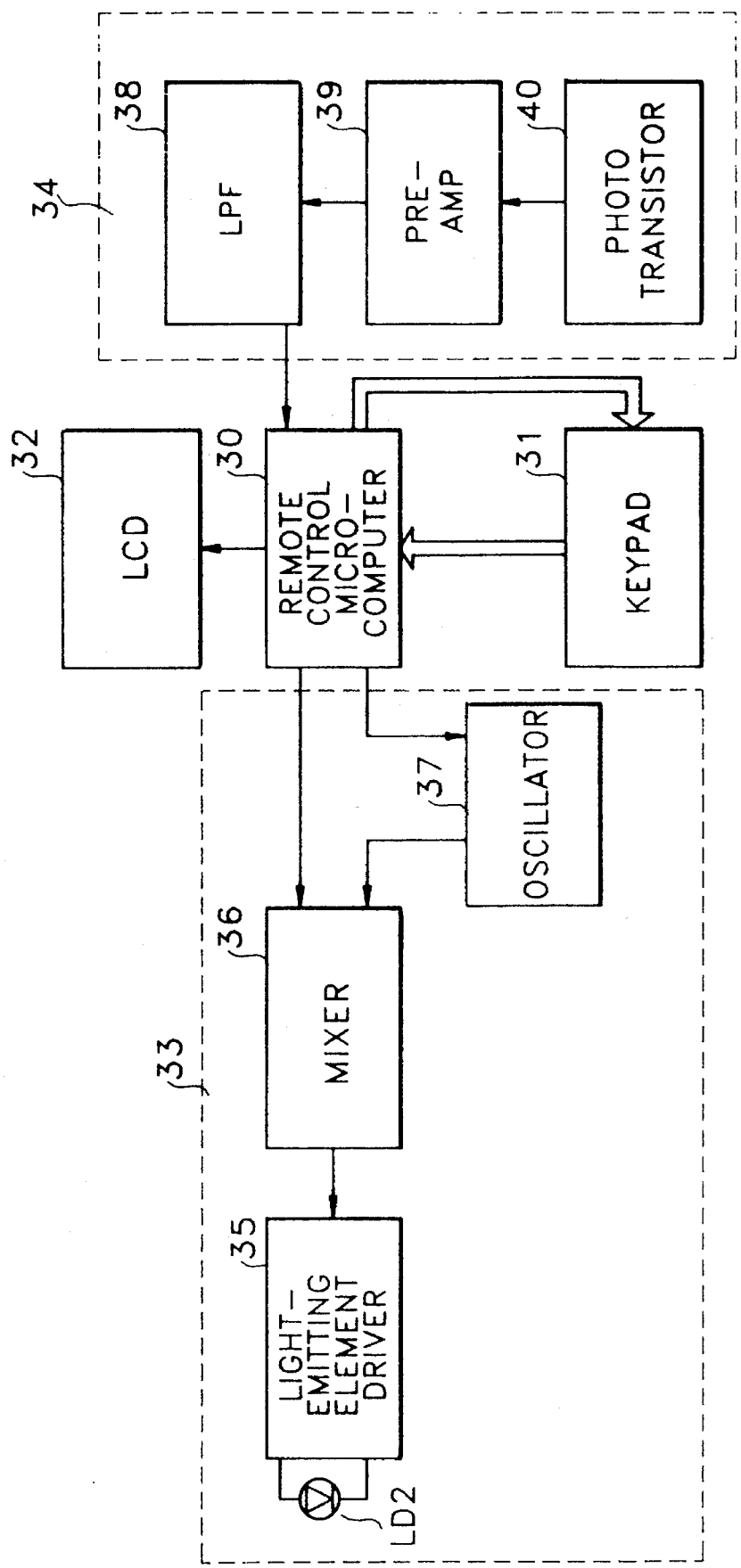
FIG. 1B is a schematic block diagram of a remote controller of an electronic device with a function for checking the power supply status according to the present invention.

As shown in FIG. 1A, a power controller 10 controls the power source of a main body, whose input terminal is connected to a portable power source, e.g., a battery 11, via a diode D. A power sensor 12 is connected to both the output terminal of power controller 10 and the output terminal of power source 11. The outputs of power sensor 12 are connected to a parallel-to-serial converter 13 which, in turn, is connected to both a system microcomputer 14 and a system transmitter 15. Power sensor 12 comprises resistors R1, R2, R3 and R4 and comparators CP1, CP2, CP3 and CP4. The system transmitter 15 is connected to system microcomputer 14, and comprises an oscillator 17 connected to an output of system microcomputer 14, a mixer 18 mixing the signals output from parallel-to-serial converter 13 and oscillator 17, and a light-emitting diode LD1. A system receiver 16 connected to system microcomputer 14 comprises a phototransistor 20, a pre-amp 21, and a low-pass filter 22.

The remote controller as shown in FIG. 1B comprises a remote control microcomputer 30, key input means, in the form of keypad 31, for inputting control signals to the remote control microcomputer 30, remote control transmitter 33, liquid crystal display 32, and remote control receiver 34. More particularly, remote control transmitter 33 comprises an oscillator 37 connected to the output of remote control microcomputer 30, a mixer 36 for mixing the output signal of oscillator 37 and the output from remote control microcomputer 30, a light-emitting diode (LED) element driver 35 connected to the output of mixer 36, and a light-emitting diode LD2. The remote control receiver 34 connected with a remote control microcomputer 30 comprises a phototransistor 40, a pre-amp 39 and a low-pass filter 38.

Reference is now made to the operation of the present invention in conjunction with FIGS. 1A and 1B.

A control signal for controlling the function of the main body in the electronic device is input via keypad 31 of the remote controller by depressing a special power confirm button on the keypad 31 so as to confirm the status of the power supply of the electronic device. The control signal corresponding to the power confirm button is input to remote control microcomputer 30 which subsequently drives oscillator 37 to generate a carrier wave of a predetermined frequency (e.g., 38 KHz). In an alternative embodiment, the power supply status may be confirmed in response to any button depressed on the keypad 31. Accordingly, any remote control function input on the keypad 31 will cause a control signal to be input to microcomputer 30. In either embodiment, the input signal from keypad 31 and the carrier wave generated in oscillator 37 are modulated in mixer 36, and then the modulated carrier wave is input to LED driver 35. The LED driver then drives light-emitting diode LD2, generating an infrared-ray optical signal and transmitting the power checking request signal input from keypad 31 to system receiver 16 of the remote device (FIG. 1A).

The phototransistor 20 of system receiver 16 receives the infrared-ray optical signal from light-emitting diode LD2 and converts it into an electrical signal. The converted signal is amplified in pre-amp 21 and supplied to low-pass filter 22. After removing the carrier in low-pass filter 22, the amplified signal is fed to system microcomputer 14. System microcomputer 14 recognizes the power checking request signal input from the system receiver 16, and drives both parallel-to-serial converter 13 and system transmitter 15.

The signal output from parallel-to-serial converter 13 is an output signal from power sensor 12 and is representative of the power supply status.

Power controller 10, which controls the power source of the electronic device, is supplied with a constant power supply via power source 11, while diode D blocks reverse current flow from the power controller 10 to the power source 11. Power sensor 12 compares voltage variations of battery 11 as divided by resistors R1–R4 with the voltage from power controller 10 as a reference voltage, thereby producing a digitized signal of either high or low logic from comparators CP1–CP4.

The digitized signal from power sensor 12 is converted via parallel-to-serial converter 13 from parallel to serial form, to make the signal suitable for transmission. In mixer 18, the power supply status signal output from parallel-to-serial converter 13 modulates a carrier wave of a predetermined frequency (e.g., 38 KHz) generated in oscillator 17, and then supplies the modulated carrier wave to LED driver 19.

The LED driver 19 drives light-emitting diode LD1 and converts the digitized power supply status signal from mixer 18 into an infrared-ray optical signal so as to transmit the signal to remote control receiver 34.

Phototransistor 40 of remote control receiver 34 receives the optical signal transmitted from light-emitting diode LD1, and converts it into an electrical signal. The converted signal is amplified in pre-amp 39, and supplied to low-pass filter 38 where the carder wave is removed from the signal, and the remaining information signal is supplied to remote control microcomputer 30.

The digitized power supply status signal input to remote control microcomputer 30 is displayed via liquid crystal display 32 according to the program stored therein. In displaying the power supply status signal on the liquid crystal display, the display time period can be limited so as to prevent excessive power consumption, and the display can be in the form of a bar-type or relative numerical value in accordance with the type of the liquid crystal display in use.

Also, it is allowable for the power supply status signal to be automatically transmitted to the remote control receiver and displayed on the liquid crystal display as described above if the voltage of the power supply (i.e., the battery) drops below a predetermined level as detected by the power sensor in the electronic device. In this alternative embodiment, a self-check routine may be additionally incorporated into the system microcomputer of the electronic device, and automatically executed to monitor the status of the power supply. According to this self:check routine, the microcomputer automatically (and periodically) transmits a status signal to the remote controller when the power supply falls below the predetermined level. As a result, the remote controller will receive the status signal and automatically display the status of the power supply of the electronic device without the depression of the special power confirm button or any button on the remote controller. In this manner, the user will be able to immediately become aware of the power supply status when the supply of power falls below the predetermined level. As the status signal is only transmitted periodically by the microcomputer of the electronic device, the remaining supply of power to the device will not be excessively drained.

As fully disclosed and described above, the present invention is advantageous in that the status of a portable power source for an electronic device whose functions are wholly controlled by a remote controller is confirmed by the remote controller.

What is claimed is:

1. A power supply checking system having an electronic device and a remote controller for transmitting and receiving signals to and from said electronic device, said electronic device having a power supply and being controlled by said remote controller, the system comprising:

in said remote controller, means for transmitting to said electronic device a power supply checking signal, and a liquid crystal display for displaying a power status indication in response to receipt of a power status signal from said electronic device;

in said electronic device, power supply checking means responsive to receipt of said power supply checking signal from said remote controller for checking the power supply status of said power supply, and transmitting means for transmitting to said remote controller said power status signal representing the status determined by said checking means, wherein the electronic device automatically transmits without an external prompt external signals indicative of the status of its power supply in response to a determination that the supply level has fallen below a predetermined level and wherein the external signals are transmitted each time the supply level has fallen below the predetermined level.

2. The checking system as claimed in claim 1, wherein said power supply checking means comprises:

a power controller for receiving a constant supply of power from a power source, and for controlling the power thus supplied from the source; and a power sensor for sensing the power supply status by comparing the supplied power with power from said power controller;

wherein the remote controller transmits the power supply checking signal in response to activation of any remote control function button on the remote controller.

3. The checking system as claimed in claim 2, wherein said power sensor senses the voltage of the supplied power and comprises resistors that divide the voltage from said power source and comparators for comparing variations of said voltage thus divided by said resistors, with the voltage of said power controller.

4. The checking system as claimed in claim 3, wherein said power supply checking means further comprises a parallel-to-serial converter for converting a parallel digital signal output from said power sensor into a serial digital signal.

5. The checking system as claimed in claim 4, wherein said power supply is a portable power supply.

6. A remote power supply checking system comprising an electronic device, and a remote controller for said electronic device, said electronic device and remote controller being capable of transmitting and receiving signals to and from each other, said electronic device having a portable power source and being controlled by said remote controller, said electronic device comprising:

a power controller for receiving a constant supply of power from a power source, and for controlling the power thus supplied from the source;

a power sensor for sensing a discharge status of said power source;

a parallel-to-serial converter for converting a parallel digital signal output from said power sensor indicating the discharge status into a serial digital signal;

a system transmitter for mixing an output signal from said parallel-to-serial converter with a predetermined frequency and transmitting the signal thus mixed;

a system receiver for receiving a signal transmitted from said remote controller; and a system microcomputer for controlling said parallel-to-serial converter and said system transmitter according to an output signal from said system receiver, wherein the electronic device automatically transmits without an external prompt external signals indicative of the status of its power supply in response to a determination that the supply level has fallen below a predetermined level and wherein the external signals are transmitted each time the supply level has fallen below the predetermined level, said remote controller comprising:

a remote control receiver for receiving a signal transmitted from said system transmitter;

key input means for generating a control signal so as to control the function of the electronic device;

a liquid crystal display for displaying on said remote controller a discharge status signal received at said remote control receiver;

a remote control microcomputer for controlling said remote control receiver and said liquid crystal display according to output signals from said key input means and said remote control receiver; and a remote control transmitter for mixing an output signal from said remote control microcomputer with a predetermined frequency and transmitting the signal thus mixed.

7. The checking system as claimed in claim 6, wherein said power sensor comprises resistors that divide a voltage of said supplied power from said power source and comparators that compare variations of said divided voltage with a voltage from said power controller, and wherein the remote controller transmits the signal in response to activation of any remote control function key on the remote controller.

8. The checking system as claimed in claim 7 further comprising a reverse current protecting diode positioned between said power controller and said power source.

9. The checking system as claimed in claim 7, wherein said remote control receiver and said system receiver each comprise a phototransistor for converting a received optical signal into an electrical signal, a pre-amp for amplifying the converted electrical signal, and a low-pass filter for removing a carrier wave from the amplified signal.

10. The checking system as claimed in claim 7, wherein said system transmitter comprises an oscillator for generating a predetermined frequency, a mixer for modulating the output signal of said oscillator with an output signal of said parallel-to-serial converter, and a light-emitting dement driver for transmitting the output of said mixer as an infrared-ray optical signal and an infrared-ray light-emitting element.

11. A power supply checking device for checking a status of a power supply of an electronic device, the checking device comprising:

a comparator, coupled to said power supply, that produces an output indicative of a difference between power output from the power supply and a reference power output;

a transmitter, coupled to said comparator, that transmits a status signal corresponding to the difference output produced by said comparator; and a control unit, coupled to said comparator and said transmitter, that controls said transmitter to transmit the status signal as an indication of the status of said power supply, wherein the electronic device automatically transmits without an external prompt external signals indicative of the status of its power supply in response to a determination that the supply level has fallen below a predetermined level and wherein the external signals are transmitted each time the supply level has fallen below the predetermined level.

12. The power supply checking device as claimed in claim 11, wherein said control unit controls said transmitter to transmit the status signal in response to a predetermined output from said comparator, and wherein a remote controller transmits a remote checking signal in response to activation of any remote control function button on the remote controller.

13. The power supply checking device as claimed in claim 12, wherein said control unit further controls said transmitter to transmit the status signal in response to the remote checking signal transmitted from the remote controller.

14. The power supply checking device as claimed in claim 13, wherein the transmitted status signal is received by the remote controller and displayed on a display contained on the remote controller.

15. The power supply checking device as claimed in claim 13, wherein the remote controller transmits the remote checking signal in response to activation of a specific power confirm button on the remote controller.

16. The power supply checking device as claimed in claim 11, wherein said control unit further controls said transmitter to transmit the status signal in response to a remote checking signal transmitted from a remote controller, and wherein the remote controller transmits the remote control checking signal in response to activation of any remote control function button on the remote controller.

17. The power supply checking device as claimed in claim 16, wherein the transmitted status signal is received by the remote controller and displayed on a display contained on the remote controller.

18. A remote controller for use in remotely controlling the functions of an electronic device that has a power supply, the remote controller comprising:

a keypad that receives input commands related to functions performed by the electronic device;

a control unit, coupled to said keypad, receiving the input commands from said keypad, and generating command signals corresponding to the functions to be performed;

a transmitter, coupled to said control unit, transmitting the command signals generated by said control unit;

a receiver, coupled to said control unit, receiving external signals from the electronic device indicative of the status of the power supply of the electronic device; and a display unit that is controlled by said control unit to display the received external signals in a form that indicates the status of the power supply, wherein the electronic device automatically transmits without external prompt external signals indicative of the status of its power supply in response to a determination that the supply level has fallen below a predetermined level and wherein the external signals are transmitted each time the supply level has fallen below the predetermined level.

19. The remote controller as claimed in claim 18, wherein said control unit outputs a power check request signal in response to function command from said keypad, and causes said transmitter to transmit the power check request signal to the electronic device, the electronic device transmitting the external signals indicative of the status of its power supply in response to receipt of the power check request signal.

20. A power supply checking system having an electronic device and a remote controller for transmitting and receiving signals to and from said electronic device, said electronic device having a power supply and being controlled by said remote controller, the system comprising:

a liquid crystal display, disposed in said remote controller, for displaying a power status indication in response to receipt of a power status signal from said electronic device; and power supply checking means responsive to signals transmitted from said remote controller for checking the power supply status of said power supply, and transmitting means for transmitting to said remote controller said status signal representing the status determined by said checking means, said power checking means and said transmitting means being disposed in said electronic device, wherein said electronic device automatically transmits without an external prompt external signals indicative of the status of its power supply when the power supply level has fallen below a predetermined level and when a function signal is received from said remote controller, wherein the external signals are transmitted each time the supply level has fallen below the predetermined level.

21. A power supply checking system having an electronic device and a remote controller for transmitting and receiving signals to and from said electronic device, said electronic device having a power supply and being controlled by said remote controller, the system comprising:

in said remote controller, means for transmitting to said electronic device a power supply checking signal, and a liquid crystal display for displaying a power status indication in response to receipt of a power status signal from said electronic device;

in said electronic device, power supply checking means responsive to receipt of said power supply checking signal from said remote controller for checking the power supply status of said power supply, and transmitting means for transmitting to said remote controller said power status signal representing the status determined by said checking means, wherein the electronic device automatically transmits without an external prompt external signals indicative of the status of its power supply in response to a determination that the supply level has fallen below a predetermined level and wherein said transmitting means in said electronic device is capable of transmitting external signals to said remote controller when said remote controller is located at a remote sight.

22. A remote power supply checking system comprising an electronic device, and a remote controller for said electronic device, said electronic device and remote controller being capable of transmitting and receiving signals to and from each other, said electronic device having a portable power source and being controlled by said remote controller, said electronic device comprising:

a power controller for receiving a constant supply of power from a power source, and for controlling the power thus supplied from the source;

a power sensor for sensing a discharge status of said power source;

a parallel-to-serial converter for converting a parallel digital signal output from said power sensor indicating the discharge status into a serial digital signal;

a system transmitter for mixing an output signal from said parallel-to-serial converter with a predetermined frequency and transmitting the signal thus mixed;

a system receiver for receiving a signal transmitted from said remote controller; and a system microcomputer for controlling said parallel-to-serial converter and said system transmitter according to an output signal from said system receiver, wherein the electronic device automatically transmits without an external prompt external signals indicative of the status of its power supply in response to a determination that the supply level has fallen below a predetermined level and wherein said transmitting means in said electronic device is capable of transmitting external signals to said remote controller when said remote controller is located at a remote sight, said remote controller comprising:

a remote control receiver for receiving a signal transmitted from said system transmitter;

key input means for generating a control signal so as to control the function of the electronic device;

a liquid crystal display for displaying on said remote controller a discharge status signal received at said remote control receiver;

a remote control microcomputer for controlling said remote control receiver and said liquid crystal display according to output signals from said key input means and said remote control receiver; and a remote control transmitter for mixing an output signal from said remote control microcomputer with a predetermined frequency and transmitting the signal thus mixed.

23. A power supply checking method for use in a system having an electronic device and a hand-held remote controller for transmitting and receiving signals to and from said electronic device, said electronic device having a power supply and being controlled by said hand-held remote controller and said hand-held remote controller having a display, the method comprising the steps of:

in said hand-held remote controller, transmitting a power supply checking signal to said electronic device;

in said electronic device, checking the power status of said power supply in response to receiving said power supply checking signal from said hand-held remote controller, determining whether a supply level of said power supply has fallen below a predetermined level, and transmitting to said hand-held remote controller external signals indicative of the status of said power supply each time said supply level has fallen below said predetermined level; and in said hand-held remote controller, displaying a power status indication signal in response to receiving said external signals remotely transmitted from said power status signal transmission step.

24. A remote power supply checking method for use in a system having an electronic device and a hand-held remote controller, said electronic device and said hand-held remote controller being capable of transmitting and receiving signals to and from each other, said electronic device having a portable power source and being controlled by said hand-held remote controller, the method comprising the steps of:

in said electronic device:
receiving a constant supply of power from said power source within said electronic device and controlling said power supplied from the power source;
sensing a discharge status of said power source;
transforming said discharge status of said power source into a parallel digital signal;
converting said parallel digital signal into a serial digital signal;
mixing said serial digital signal with a predetermined frequency to form a first mixed signal;
determining whether a supply level of said power source has fallen below a predetermined level;
automatically transmitting said first mixed signal without an external prompt as an external signal indicative of the status of said power source when said supply level has fallen below said predetermined level, wherein said external signals are transmitted each time said supply level has fallen below said predetermined level; and
receiving a second mixed signal transmitted from said hand-held remote controller;

in said hand-held remote controller:
receiving said first mixed signal transmitted from said electronic device via a remote control receiver; and
generating control signals from key inputs for controlling functions of said electronic device and said hand-held remote controller;
displaying said discharge status of said power source on a liquid crystal display in accordance with said first mixed signal;
controlling the receipt of said first mixed signal by said remote control receiver and the display of said discharge status on said liquid crystal display according to said control signals generated from said key inputs and according to signals output from said remote control receiver; and
mixing said control signals generated from said key inputs with a predetermined frequency to form said second mixed signal; and
transmitting said second mixed signal to said electronic device.

\* \* \* \* \*